United States Patent [19]

Phan et al.

[11] Patent Number: 5,001,370
[45] Date of Patent: Mar. 19, 1991

[54] HIGH SPEED ECL TO TTL TRANSLATOR HAVING A NON-SCHOTTKY CLAMP FOR THE OUTPUT STAGE TRANSISTOR

[75] Inventors: M. Nghiem Phan, Mesa; Robert D. Berger, Chandler, both of Ariz.

[73] Assignee: Xerox Corporation, Stamford, Conn.

[21] Appl. No.: 547,257

[22] Filed: Jul. 2, 1990

[51] Int. Cl.⁵ .......................................... H03K 19/013
[52] U.S. Cl. ..................... 307/475; 307/310; 307/299.3; 307/549; 307/552
[58] Field of Search ............... 307/475, 310, 299.3, 307/549, 552

[56] References Cited

U.S. PATENT DOCUMENTS

| | | | |
|---|---|---|---|
| 4,131,808 | 12/1988 | Kuo | 307/475 |
| 4,255,670 | 3/1981 | Griffith | 307/299.3 |
| 4,514,651 | 4/1985 | Miller et al. | 307/475 |
| 4,678,940 | 7/1987 | Vasseghi | 307/456 |
| 4,835,420 | 5/1989 | Rosky | 307/475 |
| 4,857,776 | 8/1989 | Khan | 307/475 |

Primary Examiner—Stanley D. Miller
Assistant Examiner—Scott A. Ouellette

[57] ABSTRACT

A high speed voltage translator is responsive to an ECL input signal for providing a TTL output signal at an output while clamping the low output voltage thereof to a predetermined value. The ECL input signal is converted to first and second complementary control signals for driving the upper and lower transistors in the output stage, respectively. The second control signal enables a third transistor, the base of which is connected via a serial diode and resistor combination to a second collector of the lower transistor in the output stage. The base-emitter junction potential of the third transistor cancels the potential across the diode whereby the collector of the lower transistor that is the output of the voltage translator is clamped at one base-emitter junction potential less the voltage across the resistor. Furthermore, the current flowing through the resistor is compensated for temperature variation whereby the low output voltage is independent of temperature. The first and second control signals enable separate charge and discharge paths for the upper and lower transistors whereby the associated propagation delays may be controlled so as to inhibit simultaneous conduction through the output stage.

24 Claims, 2 Drawing Sheets

HIGH SPEED ECL TO TTL TRANSLATOR HAVING A NON-SCHOTTKY CLAMP FOR THE OUTPUT STAGE TRANSISTOR

BACKGROUND OF THE INVENTION

This invention relates in general to voltage translators, and more particularly, to an ECL to TTL voltage translator having a clamping circuit for limiting the low level TTL output signal to a predetermined value.

It is well known that many of today's complex electronic systems mix and match integrated circuits of different logic families to accomplish a series of interrelated functions. In one example, signals produced in the ECL (emitter coupled logic) family are converted to levels compatible with the TTL (transistor-transistor logic) family by a voltage translator circuit for further processing. The output stage of the conventional ECL to TTL voltage translator typically includes upper and lower bipolar transistors alternately conducting and serially coupled between a power supply conductor operating at a positive potential such as $V_{CC}$ and a ground potential terminal. The output is provided at the interconnection of the transistor pair. The upper transistor in the output stage pulls the output terminal toward $V_{CC}$ for providing a high TTL output signal, while the lower transistor draws the output terminal toward ground potential for providing a low TTL compatible output signal. It is important to clamp the low output voltage ($V_{OL}$) within a predetermined narrow window of operation, otherwise if the $V_{OL}$ signal became too high it would exceed the generally accepted industry standard for a low TTL output signal (<500 millivolts), or if the output voltage became too low, the collector-base junction of the lower transistor could become strongly forward biased, saturating the transistor and developing excessive charge in the base region thereby slowing its switching rate to an unacceptable value.

In conventional practice, a Schottky diode is coupled between the collector and base of the lower transistor in the TTL output stage for clamping the $V_{OL}$ output signal to approximately 300-500 millivolts. While the Schottky diode behaves satisfactorily as a clamping means, the manufacturing processes to implement the Schottky diode especially in more recent semiconductor technologies, requires several complex and expensive steps including an extra masking step to form the Schottky diode and its contacts. Although it is necessary to clamp the $V_{OL}$ output signal for the reasons advanced above, it is also desirable to provide such a feature without the expense and complexity imposed by the traditional Schottky diode.

Another significant problem with the conventional TTL output stage relates to the phasing of the control signals applied at the bases of the upper and lower transistors and the associated charge and discharge rates thereof, wherein it is possible for both transistors to conduct simultaneously at the transition of the output logic state creating a short circuit current therethrough which induces spikes in the power supply lines thus creating excessive system noise and peak power. In the prior art, a phase splitter transistor is typically used for alternately enabling the upper and lower transistors in the output stage. This single point of control is susceptible to race conditions taking into account the charge and discharge rates whereby the upper and lower transistors may jointly conduct between the power supply conductors for a short period of time at the transitions of the output logic state. Preferably, the control circuitry for the output stage should insure that the active transistor is completely off before the opposite one is turned on, thus avoiding the short circuit current.

Furthermore, the low level output signal of the conventional voltage translator is often sensitive to temperature variation. The $V_{OL}$ output signal is typically determined by the base-emitter junction potential of the lower transistor less the voltage across the Schottky clamp. The P-N junctions of the lower transistor and the Schottky diode are exponential functions of temperature as seen in the well known diode equation, $V_d=(kT/q) \ln (I_d/I_s)$, where "$V_d$" is the potential across the diode, "$I_d$" is the current through the diode, "$I_s$" is the diode saturation current, "k" is Boltzman's constant, "T" is absolute temperature and "q" is the electron charge. Hence, the $V_{OL}$ output signal is known to fluctuate with temperature by as much as 200-300 millivolts from 0° C. to 125° C. which is unacceptable in some applications and undesirable in most others.

Hence, there is a need for an improved ECL to TTL translator which limits the low output voltage to a predetermined value independent of temperature and without the use of a Schottky diode clamp, while insuring that the upper and lower transistors in the output stage do not conduct simultaneously.

SUMMARY OF THE INVENTION

Accordingly, an objective of the present invention is to provide an improved ECL to TTL voltage translator.

A further objective of the present invention is to provide an improved ECL to TTL voltage translator for clamping the low TTL output voltage to a predetermined value.

Another objective of the present invention is to provide an improved ECL to TTL translator which inhibits simultaneous conduction through the serially coupled upper and lower transistors in the output stage.

Yet another objective of the present invention is to provide an improved ECL to TTL translator having temperature compensation for correcting temperature induced variation of the low output voltage.

Still another objective of the present invention is to provide an improved ECL to TTL translator having reduced manufacturing costs.

In accordance with the above and other objectives there is provided an improved ECL to TTL voltage translator for converting an input logic signal between voltage levels comprising an input stage responsive to the input logic signal and having first and second outputs for providing first and second complementary control signals. An output stage includes a first transistor having a base responsive to the first control signal, a collector coupled to a first source of operating potential and an emitter coupled to the output of the voltage translator, and a second transistor having a base, an emitter and first and second collectors, wherein the first collector is coupled to the output of the voltage translator and the emitter is coupled to a second source of operating potential. The base of a third transistor is coupled for receiving the second control signal, while the collector is coupled to the first source of operating potential and the emitter is coupled to the base of the second transistor. The first and second collectors of the second transistor are clamped to a predetermined level by a diode and resistor serially coupled between the base of the third transistor and the second collector of the second transistor.

In another aspect, the present invention includes a voltage translator for inhibiting simultaneous conduction through first and second transistors serially coupled in an output stage. The first transistor in the output stage includes a base responsive to a first control signal, a collector coupled to a first source of operating potential and an emitter coupled to the output of the voltage translator, while the second transistor includes a base responsive to a second control signal, a collector coupled to the output of the voltage translator and an emitter coupled to a second source of operating potential. An input logic signal is applied to an input stage having first and second outputs for providing the first and second control signals in response thereto. A first circuit is coupled between the first output of the input stage and the base of the first transistor for controlling the propagation delay of the first control signal, and a second circuit is coupled between the second output of the input stage and the base of the second transistor also for controlling the propagation delay of the second control signal. The base of the first transistor is coupled to the anode of a first diode while its cathode is coupled for discharging the base of the first transistor through the input stage. Likewise, the base of the second transistor is coupled to the anode of a second diode while its cathode coupled for discharging the base of the second transistor through the input stage.

DETAILED DESCRIPTION OF THE PREFERRED EMBODIMENT

Figure 1:
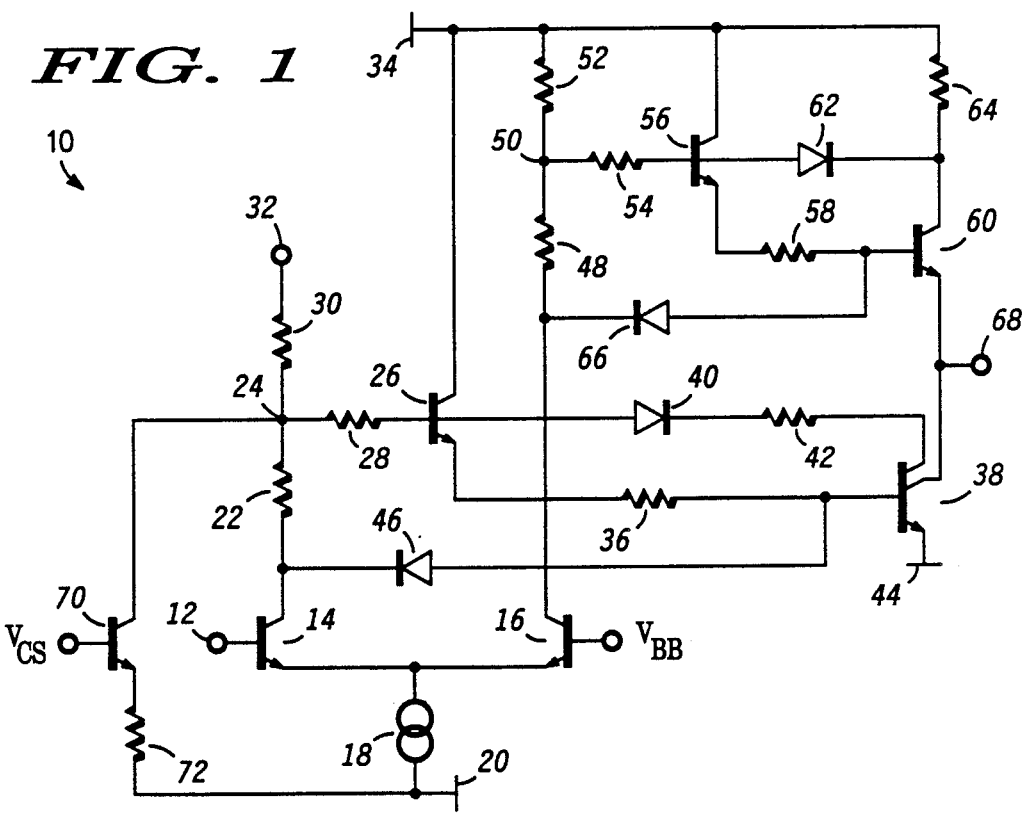
FIG. 1 is a schematic diagram illustrating the preferred embodiment of the present invention.

Referring to FIG. 1, voltage translator 10 is shown suitable for manufacturing in integrated circuit form using conventional integrated circuit processes. An ECL input signal is applied at input 12 that is the base of transistor 14, while a reference potential $V_{BB}$, typically $-1.3$ volts, is applied at the base of transistor 16. The emitters of transistors 14 and 16 are coupled together through current supply 18 to power supply conductor 20, typically operating at $-5.2$ volts. The collector of transistor 14 is coupled through resistor 22 to node 24, the latter of which is also coupled to the base of transistor 26 through resistor 28. Resistor 30 is shown coupled between node 24 and input terminal 32 which receives a positive reference potential of four times the base-emitter junction potential ($V_{be}$) of transistor 26 and independent of the power supplies. The collector of transistor 26 is coupled to power supply conductor 34, typically operating at 5 volts, while the emitter of the same is coupled through resistor 36 to the base of transistor 38. Diode 40 and resistor 42 are serially coupled between the base of transistor 26 and the first collector of transistor 38, while the emitter of transistor 38 is coupled to power supply conductor 44 typically operating at ground potential, and the base of transistor 38 is coupled through diode 46 to the collector of transistor 14. The diodes may be formed of bipolar transistors having common base and emitter terminals, as is understood.

Continuing with FIG. 1, the collector of transistor 16 is coupled through resistor 48 to node 50 and continues through resistor 52 to power supply conductor 34. Resistor 54 is coupled between node 50 and the base of transistor 56, the latter of which also includes a collector coupled to power supply conductor 34 and an emitter coupled through resistor 58 to the base of transistor 60. The anode of diode 62 is coupled to the base of transistor 56, while the cathode of the same is coupled to the collector of transistor 60 and through resistor 64 to power supply conductor 34. The base of transistor 60 is coupled to the anode of diode 66 while the cathode thereof is coupled to the collector of transistor 16. The emitter of transistor 60 and the second collector of transistor 38 form output 68 for providing the TTL output signal. Furthermore, a current source formed of transistor 70 and resistor 72 is coupled between node 24 and power supply conductor 20 wherein the base of transistor 70 receives a reference potential $V_{CS}$.

The operation of voltage translator 10 proceeds as follows. An ECL input signal is applied at input 12 having either a level of $-1.0$ volts for a logic one or a level of $-1.6$ volts for a logic zero input signal. For the case of a logic one ECL input signal, the $-1.0$ volt signal applied at input 12 enables transistor 14 and turns off transistor 16 since there is a greater potential across the base and emitter of the former. The current flowing through transistor 14 reduces the potential at node 24, turning off transistor 26 and removing the base drive of transistor 38. In addition, the lower potential at the collector of transistor 14 forward biases diode 46 thereby rapidly discharging the capacitive charge at the base of transistor 38 through the collector-emitter conduction path of transistor 14. The value of resistor 22 is selected for providing a rapid turn-on of diode 46 while at the same time keeping transistor 14 out of saturation. The collector-emitter conduction path of transistor 38 is thus rendered high impedance, releasing output 68.

As transistor 16 is turned off, node 50 is pulled toward the positive potential at power supply conductor 34 via resistor 52 thereby providing the base drive to turn on transistor 56 which in turn supplies transistor 60 in their Darlington configuration. Resistor 64 limits the current flowing through the high gain Darlington upper output stage. Output 68 is thus pulled toward the positive potential of power supply conductor 34 through transistor 60 and resistor 64 for providing a high TTL output signal. The majority of the current flowing through resistor 54 also flows through diode 62, clamping the collector of transistor 60 approximately one $V_{be}$ above the potential developed at output 68. Resistors 54 and 58 are typically selected small, say 100 ohms, for developing negligible potential thereacross since only base current flows through resistor 58. Hence, the potential at the collector of transistor 60 is equal to the potential developed at output 68 plus the $V_{be}$ of transistor 60 plus the $V_{be}$ of transistor 56 minus the voltage across diode 62. This clamps the collector voltage of transistor 60 keeping it out of saturation.

Reversing the logic state of the ECL input signal such that a $-1.6$ volt signal is applied at input 12, transistor 16 is rendered conductive while transistor 14 is turned off, thereby reducing the voltage at the collector of transistor 16, turning off transistors 56 and 60 and forward biasing diode 66. Again, resistor 48 is selected for providing a rapid turn-on level of diode 66 to discharge the base of transistor 60 while keeping transistor 16 out of saturation. As transistor 14 turns off, the potential developed at node 24 is pulled toward the positive voltage applied at input terminal 32 (4 $V_{be}$ independent of $V_{CC}$), thereby turning on transistor 26 and providing base drive for transistor 38 through resistor 36 which pulls output 68 toward the ground potential supplied at power supply conductor 44 for providing a low TTL output signal. Transistor 26 is maintained out of saturation as its collector is coupled directly to power supply conductor 34; however, it is important to also keep transistor 38 out of saturation for avoiding any slow response time.

In the prior art, a Schottky diode is coupled between the collector and base of the lower transistor in the TTL output stage; however, in the present invention the Schottky is eliminated in lieu of diode 40 and resistor 42. The majority of the current flowing through resistor 28 also flows through diode 40 and resistor 42 into the first collector of transistor 38 while only base current flows through resistor 36. Resistors 28 and 36 are selected small, say 100 ohms, for developing negligible voltage across resistor 36, hence, the potential developed at the collectors of transistor 38 is equal to the $V_{be}$ of transistor 38 plus the $V_{be}$ of transistor 26 minus the potential across diode 40 less the potential developed across resistor 42. The $V_{be}$'s of the transistors are assumed to be approximately equal, thus, the potential at the collectors of transistor 38 is equal to one $V_{be}$ minus the voltage across resistor 42 which is selected about 1K for providing approximately 450 millivolts thereacross. This clamps the collector voltage of transistor 38 to 750 millivolts (one $V_{be}$) minus 450 millivolts, or approximately 300 millivolts. The double collectors 38 insures that its buried layer is properly clamped and that the actual collector resistance for the epitaxial contact thereof does not cause transistor 38 to go into saturation.

Thus, one key feature of the present invention is the combination of transistor 26, diode 40 and resistor 42 which collectively clamp the low output voltage developed at the collectors of transistor 38 to a predetermined value, notably without a Schottky clamping diode, thereby simplified the manufacturing process for the integrated circuit. Moreover, voltage translator 10 avoids simultaneous conduction through transistors 60 and 38 by rapidly discharging the bases thereof via diodes 66 and 46 and the collector-emitter conduction paths of transistors 16 and 14, respectively. As stated, resistors 48 and 22 select the forward bias point for diodes 66 and 46, respectively, for providing the rapid turn off of transistors 60 and 38 while at the same time keeping transistors 16 and 14 out of saturation. Resistors 28 and 36 and resistors 54 and 58 provide controllable propagation delays for slowing the enabling signal of transistors 38 and 60, respectively. The larger the values for resistors 28, 36, 54 and 58, the slower the associated transistor turn-on rate. Thus, by providing a rapid discharge of the active transistor and a propagation delay before turning the opposite transistor on, the conduction of transistors 38 and 60 remains mutually exclusive thereby avoiding the short circuit current.

Figure 2:
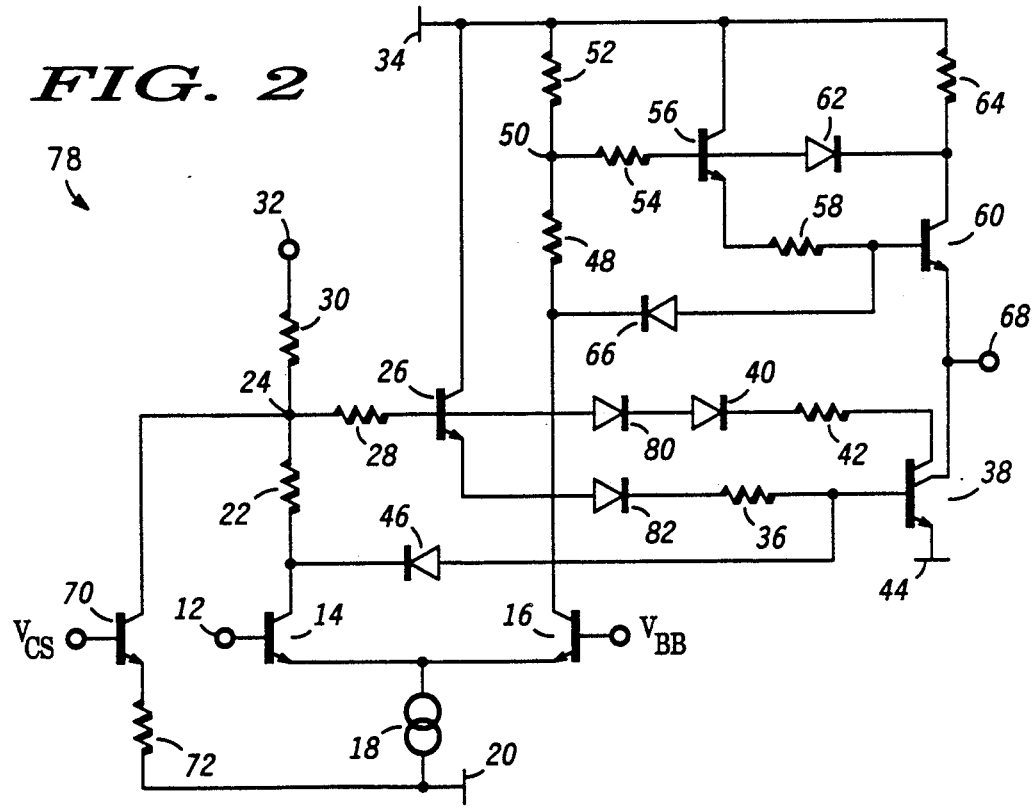
FIG. 2 is a schematic diagram illustrating an alternate embodiment of the present invention.

Turning to FIG. 2, there is shown an alternate embodiment as voltage translator 78 wherein diode 80 is coupled between the base of transistor 26 and the anode of diode 40. Furthermore, diode 82 is coupled between the emitter of transistor 26 and the base of transistor 38. Diodes 80 and 82 provide protection for diode 40 from possible breakdown from a potential overvoltage condition when the output signal is high. The clamping feature of the low output signal is not affected with additional diode pairs (i.e. 80,82) as described above since the potentials developed thereacross cancel one another. The other components having similar functions are given the same reference number as used in FIG. 1.

Figure 3:
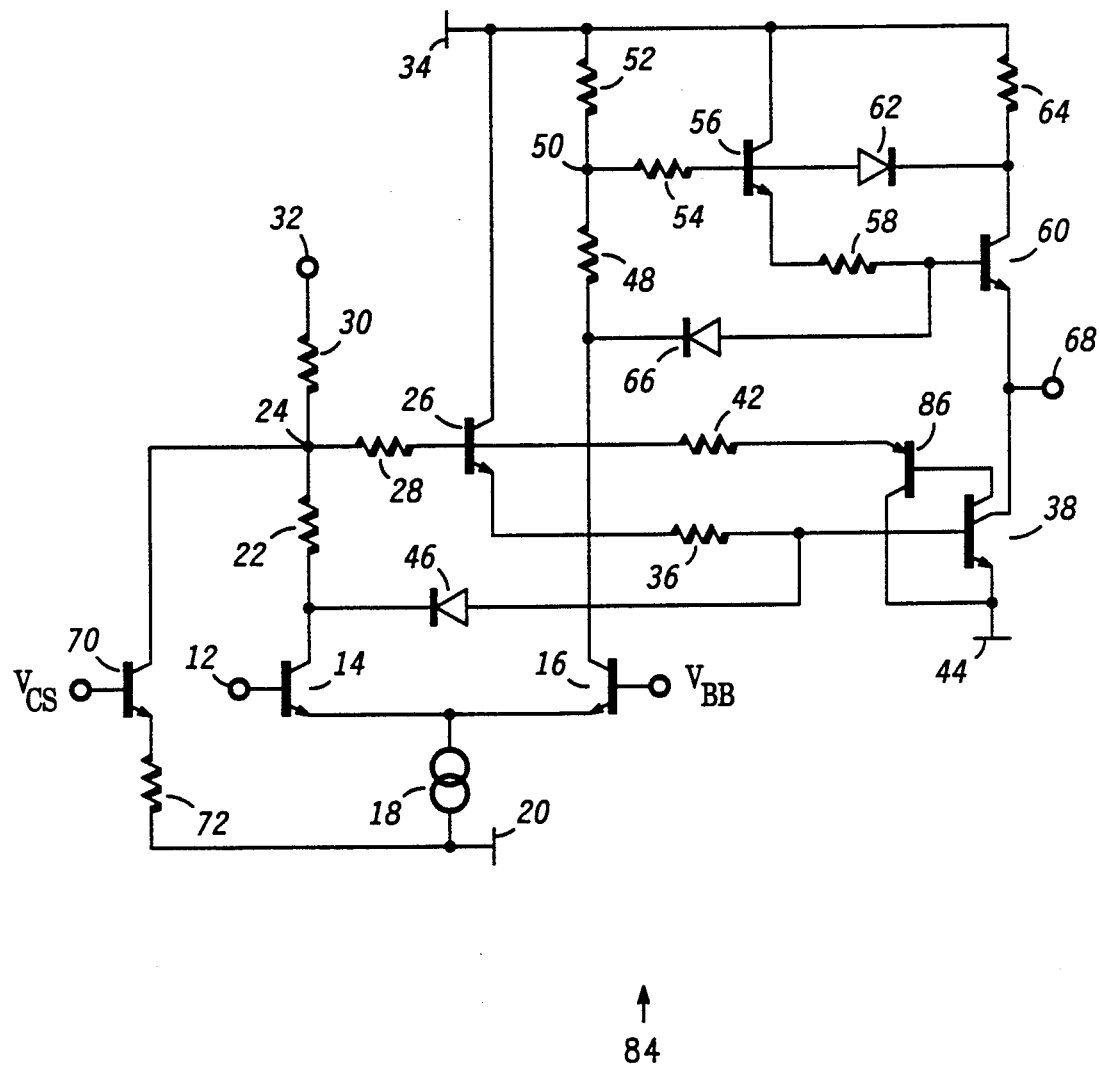
FIG. 3 is a schematic diagram illustrating yet another embodiment of the present invention.

Referring to FIG. 3, yet another embodiment of voltage translator 84 is shown wherein diode 40 is replaced with PNP transistor 86 having an emitter coupled to the base of transistor 26 via resistor 42, while its base and collector are coupled to the base of transistor 26 via resistor 42, while its base and collector are coupled to the first collector of transistor 38 and power supply conductor 44, respectively. Alternately, the collector of transistor 86 may be coupled to power supply conductor 20. This configuration avoids possible emitter-base breakdown problems since the PNP transistor possesses a higher breakdown voltage than NPN configured diode 40 shown in FIG. 1.

Another important concern for the disclosed voltage translator is the temperature induced variation of the low output voltage. Recall in the prior art that the $V_{OL}$ output signal is known to fluctuate with the $V_{be}$ of the lower transistor as a function of temperature, creating an undesirable movement in the low output signal. A temperature compensation feature is provided in the present invention by the current source formed of transistor 70 and resistor 72 for correcting this variation, as demonstrated in the following equations. In the analysis, recall that transistor 14 is turned off (zero potential across resistor 22) and that the low output voltage is equal to one $V_{be}$ minus the voltage across resistor 42 which, of course, is a function of the current flowing therethrough. The current flowing through resistor 42 is calculated as follows:

$$I_{42} = I_{30} - I_{70} \qquad (1)$$

where:
$I_{42}$ = current flowing through resistor 42
$I_{30}$ = current flowing through resistor 30
$I_{70}$ = current flowing through transistor 70

The currents flowing through resistor 30 and transistor 70 are calculated as follows with the assumption of small values for resistors 28 and 36 and therefore negligible potential loss:

$$I_{30} = \frac{V_{32} - (V_{26} + V_{38})}{R_{30}} \qquad (2)$$

$$I_{70} = \frac{V_{CS} - V_{70}}{R_{72}} \qquad (3)$$

where:
$V_{32}$ = voltage applied at input terminal 32
$V_{26}$ = base-emitter junction potential of transistor 26
$V_{38}$ = base-emitter junction potential of transistor 38
$R_{30}$ = value of resistor 30
$V_{CS}$ = voltage applied at the base of transistor 70
$V_{70}$ = base-emitter junction potential of transistor 70
$R_{72}$ = value of resistor 72

The base-emitter junction potentials of the transistors are approximately equal and the potential applied at input terminal 32 is equal to four times the base-emitter junction potential thereof, hence, equation (2) reduces to:

$$I_{30} = \frac{2 \times V_{be}}{R_{30}} \quad (4)$$

Substituting equations (3) and (4) into equation (1) yields:

$$I_{42} = \frac{2 \times V_{be}}{R_{30}} - \frac{V_{CS} - V_{70}}{R_{72}} \quad (5)$$

Furthermore, the low voltage at output 68, $V_{68}$, when transistor 38 is conducting is equal to:

$$V_{68} = V_{38} + V_{26} - V_{40} - I_{42} \times R_{42} \quad (6)$$

where:
$R_{42}$ = value of resistor 42
$V_{40}$ = voltage across diode 40
Equation (6) may be reduced to:

$$V_{68} = V_{be} - I_{42} \times R_{42} \quad (7)$$

Substituting equation (5) into equation (7) yields:

$$V_{68} = V_{be} - \left( \frac{2 \times V_{be}}{R_{30}} - \frac{V_{CS} - V_{70}}{R_{72}} \right) \times R_{42} \quad (8)$$

By setting the value of resistor 30 equal to that of resistor 72 and twice the value of resistor 42 ($R_{30} = R_{72} = 2R_{42}$), equation (8) is re-written as:

$$V_{68} = \frac{V_{CS}}{2} - \frac{V_{70}}{2} \quad (9)$$

In order to make voltage $V_{68}$ insensitive to temperature variation, one must have the derivative thereof with respect to temperature equal to zero:

$$\frac{\partial V_{68}}{\partial T} = \frac{\partial V_{CS}}{2 \partial T} - \frac{\partial V_{70}}{2 \partial T} = 0 \quad (10)$$

$$\frac{\partial V_{CS}}{\partial T} = \frac{\partial V_{70}}{\partial T}$$

From equation (10), if the temperature coefficient of the reference potential $V_{CS}$ is made equal to the temperature coefficient of the base-emitter junction of transistor 70, typically about $-1.5$ mV/°C., then the low voltage developed at output 68 does not change with temperature, as demonstrated above. The voltage $V_{CS}$ is provided by a voltage regulator circuit (not shown) having a selectable temperature coefficient, the implementation of which is believed to be well known in the art, for example, as the conventional bandgap voltage regulator. Thus by controlling the current flowing through resistor 42 via the current source formed of transistor 70 and resistor 72, the voltage developed across resistor 42, which determines the low output voltage, is compensated for temperature variation. Moreover, if reference potential $V_{CS}$ is made 1.3 volts and the base-emitter junction potential is approximately 0.7 volts, then the low voltage at output 68 is clamped at $1.3/2 - 0.7/2 = 0.3$ volts from equation (9). This is well below the industrial standard specification for low output voltage of TTL output stage and yet prevents transistor 38 from saturating.

Hence, what has been provided is a novel voltage translator responsive to an ECL input signal for providing a TTL output signal wherein the low TTL output voltage is clamped to a predetermined value independent of temperature variation. Moreover, the base of the deactivating transistor in the output stage is discharged more rapidly than the opposite one is enabled thereby preventing simultaneous conduction therethrough.

We claim:

1. A voltage translator for converting an input logic signal between voltage levels, comprising:
   first means responsive to the input logic signal and having first and second outputs for providing first and second complementary control signals;
   an output stage including,
      a first transistor having a base, an emitter and a collector, said base being responsive to said first control signal, said collector being coupled to a first source of operating potential, said emitter being coupled to the output of the voltage translator, and
      a second transistor having a base, an emitter and first and second collectors, said first collector being coupled to the output of the voltage translator, said emitter being coupled to a second source of operating potential;
   a third transistor having a base, an emitter and a collector, said base being coupled for receiving said second control signal, said collector being coupled to said first source of operating potential, said emitter being coupled to said base of said second transistor; and
   second means coupled between said base of said third transistor and said second collector of said second transistor for clamping the potential developed at said first and second collectors of said second transistor to a predetermined level.

2. The voltage translator of claim 1 wherein said second means includes a first diode and a first resistor serially coupled between said base of said third transistor and said second collector of said second transistor.

3. The voltage translator of claim 2 further including a second resistor coupled between said emitter of said third transistor and said base of said second transistor.

4. The voltage translator of claim 3 further including a third resistor coupled between said second output of said first means and said base of said third transistor.

5. The voltage translator of claim 4 wherein said output stage further includes:
   a fourth transistor having a base, an emitter and a collector, said collector being coupled to said first source of operating potential;
   a fourth resistor coupled between said first output of said first means and said base of said fourth transistor;
   a fifth resistor coupled between said emitter of said fourth transistor and said base of said first transistor; and
   a second diode having an anode coupled to said base of said fourth transistor and a cathode coupled to said collector of said first transistor; and
   a sixth resistor coupled between said collector of said first transistor and said first source of operating potential.

6. The voltage translator of claim 5 wherein said first means includes:
   current supply means having an output for providing a current of predetermined magnitude;

fifth and sixth transistors each having a base, an emitter and a collector, said bases being responsive to the input logic signal, said emitters being coupled together to said output of said current supply means;

seventh and eighth resistors serially coupled between said collector of said fifth transistor and said first source of operating potential wherein said first output of said first means is provided at the interconnection of said seventh and eighth resistors; and ninth and tenth resistors serially coupled between said collector of said sixth transistor and a terminal at which a reference potential is applied wherein said second output of said first means is provided at the interconnection of said ninth and tenth resistors.

7. The voltage translator of claim 6 further including:

a third diode having an anode coupled to said base of said second transistor and a cathode coupled to said collector of said sixth transistor; and a fourth diode having an anode coupled to said base of said first transistor and a cathode coupled to said collector of said fifth transistor.

8. The voltage translator of claim 1 further including current supply means coupled to said second output of said first means for providing a current which maintains the potential developed at said first and second collectors of said second transistor independent of temperature variation.

9. The voltage translator of claim 8 wherein said current supply means includes:

a fourth transistor having a base, an emitter and a collector, said base being responsive to a reference potential, said collector being coupled to said second output of said first means; and a second resistor coupled between said emitter of said fourth transistor and a third source of operating potential.

10. A circuit for converting the voltage levels of an input logic signal including an input stage responsive to the input logic signal and having first and second outputs for providing first and second complementary control signals; and an output stage including a first transistor having a base responsive to the first control signal, a collector coupled to a first source of operating potential and an emitter coupled to the output of the voltage translator, and a second transistor having a base, an emitter and first and second collectors wherein the first collector is coupled to the output of the voltage translator and the emitter is coupled to a second source of operating potential, wherein the improvement comprises:

a third transistor having a base, an emitter and a collector, said base being coupled for receiving the second control signal, said collector being coupled to the first source of operating potential, said emitter being coupled to the base of the second transistor; and circuit means coupled between said base of said third transistor and the second collector of the second transistor for clamping the potential developed at the first and second collectors of the second transistor to a predetermined level.

11. The voltage translator of claim 10 wherein said circuit means includes a first diode and a first resistor serially coupled between said base of said third transistor and said collector of said second transistor.

12. The voltage translator of claim 11 further including a second resistor coupled between said emitter of said third transistor and the base of the second transistor.

13. The voltage translator of claim 12 further including a third resistor coupled between the second output of the input stage and said base of said third transistor.

14. The voltage translator of claim 13 wherein the output stage further includes:

a fourth transistor having a base, an emitter and a collector, said collector being coupled to the first source of operating potential;

a fourth resistor coupled between the first output of the input stage and said base of said fourth transistor;

a fifth resistor coupled between said emitter of said fourth transistor and the base of the first transistor; and a second diode having an anode coupled to said base of said fourth transistor and a cathode coupled to the collector of the first transistor; and a sixth resistor coupled between the collector of the first transistor and the first source of operating potential.

15. The voltage translator of claim 14 wherein the input stage includes:

current supply means having an output for providing a current of predetermined magnitude;

fifth and sixth transistors each having a base, an emitter and a collector, said bases being responsive to the input logic signal, said emitters being coupled together to said output of said current supply means;

seventh and eighth resistors serially coupled between said collector of said fifth transistor and the first source of operating potential wherein the first output of the input stage is provided at the interconnection of said seventh and eighth resistors; and ninth and tenth resistors serially coupled between said collector of said sixth transistor and a terminal at which a reference potential is applied wherein the second output of the input stage is provided at the interconnection of said ninth and tenth resistors.

16. The voltage translator of claim 15 further including:

a third diode having an anode coupled to the base of the second transistor and a cathode coupled to said collector of said sixth transistor; and a fourth diode having an anode coupled to the base of the first transistor and a cathode coupled to said collector of said fifth transistor.

17. The voltage translator of claim 16 wherein said first diode comprises an eighth transistor having a base, an emitter and a collector, said base being coupled to the second collector of the second transistor, said emitter being coupled through said first resistor to said base of said third transistor, said collector being coupled to the second source of operating potential.

18. The voltage translator of claim 10 further including current supply means coupled to the second output of the input stage for providing a current which maintains the current flowing through said first resistor independent of temperature variation.

19. The voltage translator of claim 18 wherein said current supply means includes:

a fourth transistor having a base, an emitter and a collector, said base being responsive to a reference potential, said collector being coupled to the second output of the input stage; and a second resistor coupled between said emitter of said fourth transistor and a third source of operating potential.

20. A voltage translator for inhibiting simultaneous conduction through first and second transistors serially coupled in an output stage, wherein the first transistor includes a base responsive to a first control signal, a collector coupled to a first source of operating potential and an emitter coupled to the output of the voltage translator, while the second transistor includes a base responsive to a second control signal, a collector coupled to the output of the voltage translator and an emitter coupled to a second source of operating potential, wherein the voltage translator further comprises:

an input stage responsive to an input signal and having first and second outputs for providing the first and second control signals;

first means coupled between said first output of said input stage and the base of the first transistor for controlling the propagation delay of said first control signal;

second means coupled between said second output of said input stage and the base of the second transistor for controlling the propagation delay of said second control signal;

a first diode having an anode coupled to the base of the first transistor and a cathode coupled for discharging the base of the first transistor through said input stage; and a second diode having an anode coupled to the base of the second transistor and a cathode coupled for discharging the base of the second transistor through said input stage.

21. The voltage translator of claim 20 wherein said first means includes:

a third transistor having a base, an emitter and a collector, said base being coupled for receiving the first control signal, said collector being coupled to the first source of operating potential;

a first resistor coupled between said first output of said input stage and said base of said third transistor; and a second resistor coupled between said emitter of said third transistor and the base of the first transistor.

22. The voltage translator of claim 21 wherein said second means includes:

a fourth transistor having a base, an emitter and a collector, said base being coupled for receiving the second control signal, said collector being coupled to the first source of operating potential;

a third resistor coupled between said second output of said input stage and said base of said fourth transistor; and a fourth resistor coupled between said emitter of said fourth transistor and the base of the second transistor.

23. The voltage translator of claim 22 wherein said input stage includes:

current supply means having an output for providing a current of predetermined magnitude;

fifth and sixth transistors each having a base, an emitter and a collector, said base of said fifth transistor being coupled for receiving said input signal, said emitters being coupled together to said output of said current supply means, said collectors being respectively coupled to said cathodes of said first and second diodes;

fifth and sixth resistors serially coupled between said collector of said fifth transistor and the first source of operating potential wherein said first output of said input stage is provided at the interconnection of said fifth and sixth resistors; and seventh and eighth resistors serially coupled between said collector of said sixth transistor and a terminal at which a reference potential is applied wherein said second output of said input stage is provided at the interconnection of said seventh and eighth resistors.

24. A method of clamping the low level output signal provided at the interconnection of first and second serially coupled transistors in the output stage of a voltage translator circuit to a predetermined value, comprising the steps of:

developing first and second complementary control signals in response to an input logic signal;

enabling a third transistor with said first control signal for providing a drive signal at an emitter thereof;

enabling the second transistor with said drive signal for providing a low level output signal at a first collector of the second transistor; and developing a potential across a diode and a resistor serially coupled between a base of said third transistor and a second collector of said second transistor for clamping the potential developed at the first and second collectors of the second transistor to a predetermined level.

* * * * *

UNITED STATES PATENT AND TRADEMARK OFFICE
CERTIFICATE OF CORRECTION

PATENT NO.   :  5,001,370

DATED        :  March 19, 1991

INVENTOR(S)  :  M. Nghiem Phan, Robert D. Berger

It is certified that error appears in the above-identified patent and that said Letters Patent is hereby corrected as shown below:

On the title page, item [73] change Assignee from "Xerox Corporation, Stamford, Conn." to --Motorola Inc., Schaumburg, Ill.--

Signed and Sealed this

Twenty-ninth Day of December, 1992

Attest:

DOUGLAS B. COMER

*Attesting Officer*          *Acting Commissioner of Patents and Trademarks*